(12) United States Patent
Frosien

(10) Patent No.: US 9,984,848 B2
(45) Date of Patent: May 29, 2018

(54) MULTI-BEAM LENS DEVICE, CHARGED PARTICLE BEAM DEVICE, AND METHOD OF OPERATING A MULTI-BEAM LENS DEVICE

(71) Applicant: ICT Integrated Circuit Testing Gesellschaft für Halbleiterprüftechnik mbH, Heimstetten (DE)

(72) Inventor: Jürgen Frosien, Riemerling (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 30 days.

(21) Appl. No.: 15/066,816

(22) Filed: Mar. 10, 2016

(65) Prior Publication Data
US 2017/0263413 A1 Sep. 14, 2017

(51) Int. Cl.
| | |
|---|---|
| *H01J 37/141* | (2006.01) |
| *H01J 37/12* | (2006.01) |
| *H01J 37/147* | (2006.01) |
| *H01J 37/21* | (2006.01) |
| *H01J 37/28* | (2006.01) |

(52) U.S. Cl.
CPC .......... *H01J 37/12* (2013.01); *H01J 37/1474* (2013.01); *H01J 37/21* (2013.01); *H01J 37/28* (2013.01); *H01J 2237/152* (2013.01); *H01J 2237/1516* (2013.01); *H01J 2237/2448* (2013.01); *H01J 2237/24475* (2013.01)

(58) Field of Classification Search
CPC ........ H01J 37/12; H01J 37/141; H01J 37/145; H01J 37/21; H01J 37/28; H01J 2237/1516; H01J 2237/152; H01J 2237/24475; H01J 2237/2448
USPC .......................................................... 250/311
See application file for complete search history.

(56) References Cited

U.S. PATENT DOCUMENTS

| | | | | |
|---|---|---|---|---|
| 3,715,580 | A * | 2/1973 | Maekawa | B82Y 10/00 250/397 |
| 4,209,698 | A * | 6/1980 | Hoppe | H01J 37/04 250/311 |
| 7,663,102 | B2 * | 2/2010 | Frosien | H01J 37/09 250/310 |
| 2003/0089851 | A1 * | 5/2003 | Katagami | H01J 37/256 250/307 |

(Continued)

*Primary Examiner* — Eliza Osenbaugh-Stewart
(74) *Attorney, Agent, or Firm* — Kilpatrick Townsend & Stockton LLP

(57) ABSTRACT

A multi-beam lens device is described, which includes: a first beam passage for a first charged particle beam formed along a first direction between a first beam inlet of the first beam passage and a first beam outlet of the first beam passage; a second beam passage for a second charged particle beam formed along a second direction between a second beam inlet of the second beam passage and a second beam outlet of the second beam passage, wherein the first direction and the second direction are inclined with respect to each other by an angle ($\alpha$) of 5° or more such that the first beam passage approaches the second beam passage toward the first beam outlet; and a common excitation coil or a common electrode arrangement configured for focussing the first charged particle beam and the second charged particle beam. Further, a charged particle beam device as well as a method of operating a multi-beam lens device are described.

20 Claims, 8 Drawing Sheets

(56) References Cited

U.S. PATENT DOCUMENTS

| | | | |
|---|---|---|---|
| 2006/0151713 A1* | 7/2006 | Adamec | H01J 37/12 250/396 ML |
| 2006/0169910 A1* | 8/2006 | Frosien | B82Y 10/00 250/396 ML |
| 2009/0261266 A1* | 10/2009 | Lanio | B82Y 10/00 250/396 ML |
| 2015/0060662 A1* | 3/2015 | Chen | H01J 37/145 250/307 |

* cited by examiner

MULTI-BEAM LENS DEVICE, CHARGED PARTICLE BEAM DEVICE, AND METHOD OF OPERATING A MULTI-BEAM LENS DEVICE

TECHNICAL FIELD

Embodiments described herein relate to multi-beam lens devices for two or more charged particle beams, e.g. electron beams, as well as to charged particle beam devices, e.g. for inspection system applications, testing system applications, defect review or critical dimensioning applications, surface imaging applications (SEM) or the like. Embodiments also relate to methods of operating multi-beam lens devices and charged particle beam devices. Embodiments further relate to an objective lens configured as a multi-beam lens device for two or more charged particle beams, as well as to multicolumn charged particle beam devices utilizing at least one multi-beam lens device.

BACKGROUND

Modern semiconductor technology has created a high demand for structuring and probing specimens in the nanometer or even in the sub-nanometer scale. Micrometer and nanometer scale process control, inspection or structuring is often done with charged particle beams, e.g. electron beams, which are generated, shaped, deflected and focused in charged particle beam devices, such as electron microscopes or electron beam pattern generators. For inspection purposes, charged particle beams offer superior spatial resolution compared to, e.g., photon beams, because their wavelengths are shorter than the wavelengths of light beams.

Inspection devices using charged particle beams such as scanning electron microscopes (SEM) have many functions in a plurality of industrial fields, including, but not limited to, inspection of electronic circuits during manufacturing, exposure systems for lithography, detecting devices, defect inspection tools, and testing systems for integrated circuits. In such particle beam systems, fine probes with high current density can be used. For instance, in the case of an SEM, the primary electron (PE) beam generates signal particles like secondary electrons (SE) and/or backscattered electrons (BSE) that can be used to image and analyze a specimen.

One drawback of electron-beam based systems is the limited probe current within the focused spot. With increasing resolution (decreasing spot size), probe current is further decreased because of a reduced aperture angle required to control the aberrations. Higher brightness sources can provide only limited improvements for the probe current, because of the electron-electron interactions. Many approaches have been made to reduce e-e interactions in electron beam systems, which are, for example, reduced column length and/or higher column energy combined with late deceleration of the electron beam to the final landing energy just in front of the sample. However, improvement of single electron beam throughput at required resolution is increasingly challenging. One approach to solve such problems is the use of multiple beams.

Individually directing, deflecting, shaping, correcting, and focusing the individual charged particle beams of a multi-beam system is, however, challenging, in particular when complex sample structures are to be inspected or imaged on a nanoscale resolution.

Accordingly, there is a need for multi-beam lens devices and for charged particle beam devices which may provide excellent field qualities to be used for inspecting or imaging sample structures with high resolution, while gaining much information about the sample structure.

SUMMARY

In light of the above, according to the independent claims, a multi-beam lens device as well as a charged particle beam device with a multi-beam lens device are provided. Further, methods of operating a multi-beam lens device and methods of operating a charged particle beam device are provided. Further aspects, advantages, and features of the embodiments are apparent from the dependent claims, the description, and the accompanying drawings.

According to one aspect described herein, a multi-beam lens device for a charged particle beam device is provided, including: a multi-beam lens device, comprising: a first beam passage for a first charged particle beam formed along a first direction between a first beam inlet of the first beam passage and a first beam outlet of the first beam passage; a second beam passage for a second charged particle beam formed along a second direction between a second beam inlet of the second beam passage and a second beam outlet of the second beam passage, wherein the first direction and the second direction are inclined with respect to each other by an angle of 5° or more such that the first beam passage approaches the second beam passage toward the first beam outlet; and a common excitation coil or a common electrode arrangement configured for focussing the first charged particle beam and the second charged particle beam.

In some embodiments, the multi-beam lens device is configured for focussing the first charged particle beam and the second charged particle beam to a common spot.

According to a further aspect described herein, a charged particle beam device is provided, including: an objective lens configured as a multi-beam lens device, a first column, and a second column. The multi-beam lens device includes: a first beam passage for a first charged particle beam formed along a first direction between a first beam inlet of the first beam passage and a first beam outlet of the first beam passage; a second beam passage for a second charged particle beam formed along a second direction between a second beam inlet of the second beam passage and a second beam outlet of the second beam passage, wherein the first direction and the second direction are inclined with respect to each other by an angle of 5° or more such that the first beam passage approaches the second beam passage toward the first beam outlet; and a common excitation coil or a common electrode arrangement configured for focussing the first charged particle beam and the second charged particle beam on a sample. The first column is configured to guide the first charged particle beam toward the first beam inlet of the first beam passage; and the second column is configured to guide the second charged particle beam toward the second beam inlet of the second beam passage.

In some embodiments, the multi-beam lens device is configured for focussing the first charged particle beam and the second charged particle beam to a common spot on the sample.

According to a further aspect described herein, a method of operating a multi-beam lens device is provided, including: directing a first charged particle beam through a first beam passage of the multi-beam lens device along a first direction; directing a second charged particle beam through a second beam passage of the multi-beam lens device along a second direction which is inclined with respect to the first direction by an angle of 5° or more such that the first charged particle beam and the second charged particle beam approach each other; and exciting a common excitation coil or a common electrode arrangement for focussing the first charged particle beam and the second charged particle beam. According to some embodiments of the disclosure, the method of operating a multi-beam lens device can be conducted with a multi-beam lens device according to any embodiments, examples and combinations thereof described in the present disclosure.

Embodiments are also directed at apparatuses for carrying out the disclosed methods and include apparatus parts for performing the individual method actions. The methods may be performed by way of hardware components, a computer programmed by appropriate software, by any combination of the two or in any other manner. Furthermore, embodiments are also directed at methods of operating the described apparatuses.

Further advantages, features, aspects and details that can be combined with embodiments described herein are evident from the dependent claims, the description and the drawings.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to one or more embodiments and are detailed in the description which follows.

DETAILED DESCRIPTION

Reference will now be made in detail to the various embodiments, one or more examples of which are illustrated in the figures. Within the following description of the drawings, the same reference numbers refer to the same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Semiconductor device technology is developing into the direction of further structure miniaturization in the deep nanometer region as well as into the 3D direction. Structures of interest are no longer essentially planar, but may also build up in the z-direction, which is a direction perpendicular to a surface plane of the sample to be inspected. It may be beneficial to image 3D structures in process diagnostic and inspection with nanometer resolution. For example, the imaging of side walls as well as of bottoms of deep holes and trenches with high aspect ratio may be a challenge. There may also be an interest to image a layer structure buried inside a sample. For example, it may be beneficial to generate 3D-information about the surface structures of a sample from a scanning electron microscope (SEM).

Optical performance of a charged particle beam device can be improved by improving the resolution, i.e. by reducing the spot size on a sample, as well as by improving signal electron detection. Signal electron detection may encompass both the detection of secondary electrons (SE), i.e. signal electrons generated at the sample when being hit by the primary electrons (PE), and the detection of backscattered electrons (BSE), i.e. primary electrons backscattered from the sample at various scattering angles. Whereas secondary electrons may typically be low-energy electrons in an energy range of several eV up to a few tens of eV, backscattered electrons may have particle energies of several keV, e.g. between 1 keV and 30 keV or more.

Both the resolution and the signal electron detection may be improved by utilizing a low-aberration, compact lens device as at least one of an objective lens for focussing charged particle beams on a sample and a transfer lens for focussing charged particle beams toward optical components such as beam switches, beam separators, or beam deflectors.

Figure 1:
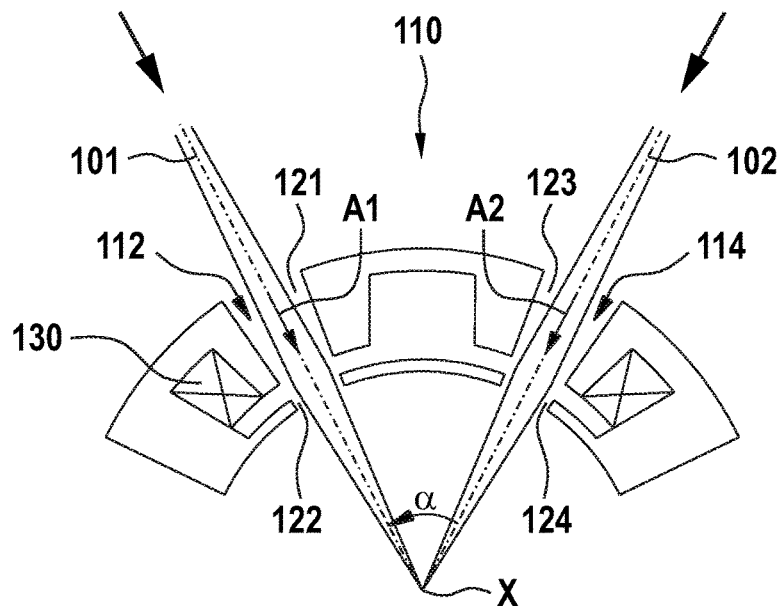
FIG. 1 shows a multi-beam lens device according to embodiments described herein in a schematic sectional view.

FIG. 1 shows a multi-beam lens device 110 according to embodiments described herein. The multi-beam lens device 110 includes a first beam passage 112 for a first charged particle beam 101, and at least one second beam passage 114 for a second charged particle beam 102. In some embodiments, the multi-beam lens device may include more than two beam passages, e.g. a third beam passage for a third charged particle beam, a fourth beam passage for a fourth charged particle beam, a fifth beam passage for a fifth charged particle beam, or more than five beam passages.

As is further shown in FIG. 1, the multi-beam lens device 110 includes a first beam inlet 121 and a first beam outlet 122, wherein the first beam passage 112 is formed along a first direction A1 between the first beam inlet 121 and the first beam outlet 122. Further, the multi-beam lens device 110 includes a second beam inlet 123 and a second beam outlet 124, wherein the second beam passage 114 is formed along a second direction A2 between the second beam inlet 123 and the second beam outlet 124. The first direction A1 and the second direction A2 are inclined with respect to each other by an angle α of 5° or more. The first beam passage 112 and the second beam passage 114 may extend at the angle α of 5° with respect to each other through the multi-beam lens device 110.

In some embodiments, the first direction A1 and the second direction A2 may be inclined with respect to each other by an angle α of 10° or more, particularly 15° or more, more particularly 20° or more, or even 25° or more. In some embodiments, the first direction A1 and the second direction A2 may be inclined with respect to each other by an angle α of 60° or less, particularly 45° or less. In some embodiments, the first direction A1 and the second direction A2 may be inclined by an angle of about 35° with respect to each other. For example, the first beam passage 112 and the second beam passage may extend at an angle between 25° and 45° with respect to each other through the multi-beam lens device.

When the multi-beam lens device includes more than two beam passages, wherein each beam passage extends along a respective direction, the angle between any pair of directions may be 5° or more, particularly 15° or more, more particularly 25° or more. In other words, the minimum tilting angle between two beam passages may be 25° or more.

As is shown in FIG. 1, the first beam passage 112 approaches the second beam passage 114 toward the first beam outlet 122. In other words, a distance between the first beam outlet 122 and the second beam outlet 124 may the smaller than a distance between the first beam inlet 121 and the second beam inlet 123. Accordingly, the first charged particle beam 101 propagating through the first beam passage 112 along the first direction comes closer to the second charged particle beam 102 propagating through the second beam passage 114 along the second direction in a direction from the respective beam inlet to the respective beam outlet.

In some embodiments, which may be combined with other embodiments described herein, the multi-beam lens device 110 may be configured for focussing the first charged particle beam 101 and the second charged particle beam 102 to a common spot X. In other words, the multi-beam lens device may be configured to focus the first charged particle beam 101 propagating through the first beam passage 112 such that a crossover of the first charged particle beam 101 is formed at the position of the common spot X. Further, the multi-beam lens device may be configured to focus the second charged particle beam 102 propagating through the second beam passage 114 such that a crossover of the second charged particle beam 103 is formed at the position of the common spot X.

In some embodiments, the first beam passage 112 and the second beam passage 114 may extend in such a way through the multi-beam lens device that their linear extensions cross at a crossing point, wherein the crossing point may correspond to the common spot X. For example, the first beam passage 112 and the second beam passage 114 may extend radially from the common spot X through the multi-beam lens device 110.

A "multi-beam lens device" as used herein may refer to a lens for focussing two or more charged particle beams, in particular two or more electron beams, which may propagate adjacent to each other in a charged particle beam device. For example, a distance between the first charged particle beam and the second charged particle beam entering the multi-beam lens device may be 5 mm or more and 100 mm or less, particularly 10 mm or more and 40 mm or less. Accordingly, a first distance between the first beam inlet 121 and the second beam inlet 123 (i.e. between the respective centers of the beam inlets) may be 5 mm or more and 100 mm or less, particularly 10 mm or more and 40 mm or less.

As the first direction A1 and the second direction A2 are tilted with respect to each other, a second distance between the first beam outlet 122 and the second beam outlet 124 (i.e. between the respective centers of the beam outlets) may be smaller than the first distance. In other words, the beam passages approach each other in the direction from the beam inlets toward the beam outlets.

A "beam inlet" as used herein may refer to an entrance of a beam passage or an opening in a lens body of the multi-beam lens device 110, where a charged particle beam may enter the multi-beam lens device. Similarly, a "beam outlet" as used herein may refer to an opposing end of the beam passage or the opening, where the charged particle beam may exit the multi-beam lens device to be focussed by the multi-beam lens device. During propagation through the multi-beam lens device, magnetic, electrostatic or combined magnetic and electrostatic fields may act on the charged particle beam for focussing the charged particle beam. The beam passages are not necessarily entirely surrounded by wall elements of the multi-beam lens device, and can be formed as at least partially open passages. In some embodiments, the passages are partially or entirely surrounded by wall sections of the multi-beam lens device, e.g. by an upper pole piece and/or a lower pole piece.

In some embodiments described herein, which may be combined with other embodiments described herein, the multi-beam lens device may include a lens body with multiple bores, wherein each bore defines a beam passage. The bores may extend essentially linearly or slightly curved through the lens body. Such a multi-lens arrangement may also be referred to as a "hedgehog" lens, as the charged particle beams propagating toward the multi-beam lens device look like the spines of a hedgehog with respect to a hedgehog body.

In some embodiments, the first beam passage 112 and the second beam passage 114 may extend through the first and the second pole piece of the multi-beam lens device 110, wherein a pole gap may be provided between the first and second pole pieces for a focussing field to act on the charged particle beam inside the respective passage.

According to some embodiments described herein, the first direction A1 is tilted with respect to the second direction A2 by an angle α of 5° or more. The first direction A1 may be defined by an, e.g. linear, extension direction of the first beam passage 112, and the second direction A2 may be defined by an, e.g. linear, extension direction of the second beam passage 114. For example, the first direction A1 may correspond to a connection line between a center of the first beam inlet 121 and a center of the first beam outlet 122, and the second direction A2 may correspond to a connection line between a center of the second beam inlet 123 and a center of the second beam outlet 124.

In some embodiments, the first beam passage 112 and the second beam passage 114 may extend essentially linearly through the multi-beam lens device 110. In other embodiments, the beam passages may be curved. In some embodiments, as the multi-beam lens device may include a scanning deflector system for deflecting the charged particle beams, the charged particle beams may propagate through the multi-beam lens device along an at least partially curved beam path, respectively.

The beam inlets and the beam outlets may be provided as round or circular openings in a lens body of the multi-beam lens device 110.

The multi-beam lens device 110 may be a magnetic lens and/or an electrostatic lens. In the case of a magnetic lens, a common excitation coil 130 for focussing the first charged particle beam 101 and for focussing the second charged particle beam 102 may be provided. Therein, the common excitation coil 130 may be configured to generate a focussing field at the first beam passage 112 and at the second beam passage 114.

In the case of an electrostatic lens, a common electrode arrangement may be provided. The common electrode arrangement may be configured to generate a focussing field at the first beam passage 112 and at the second beam passage 114. In some embodiments, the common electrode arrangement may include a common electrode for focussing both the first charged particle beam and the second charged particle beam. The common electrode may be connected to a common voltage supply.

In the embodiment shown in FIG. 1, the multi-beam lens device 110 is a magnetic lens including a common excitation coil 130 configured to focus both the first charged particle beam 101 and the second charged particle beam 102, e.g. to a common spot X. The common excitation coil 130 may extend in a circumferential direction around both the first and the second charged particle beam, e.g. in a single closed loop. For example, the common excitation coil 130 may be provided in a coil accommodation space provided in a lens body of the multi-beam lens device, wherein the coil accommodation space forms a loop around all beam passages. The magnetic field provided by the common excitation coil may enter the beam passages via gaps provided between upper and lower pole pieces of the lens body.

A particularly compact multi-beam lens setup is possible, when the common excitation coil 130 is configured for focussing multiple charged particle beams to a common spot X. In particular, not every beam passage needs to be provided with an own excitation coil. Further, the multiple beam passages, which are tilted with respect to each other, may be provided to extend through the multi-beam lens device at close distances with respect to each other. In particular, the common excitation coil does not extend between the individual beam passages, but may only be provided at a periphery of the multi-beam lens device.

The multi-beam lens device 110 according to embodiments described herein may be used in various applications, as will be explained in the following.

In a first example, the multi-beam lens device 110 can be used as an objective lens of a charged particle beam device. Therein, the multi-beam lens device is configured to focus the first and at least one second charged particle beam to a common spot X on a sample, e.g. on a sample with three-dimensional sample features to be inspected. Deep hole imaging with an aspect ratio >10 and imaging of overlay structures may be possible. Targeting multiple charged particle beams on the same sample location from different directions may be possible via an objective lens configured as a multi-beam lens device according to embodiments described herein, which may enable also tomography of sample structures beside top view and side view.

In some embodiments, the primary electrons may have a high landing energy, e.g. a landing energy of 1 keV or more and/or 100 keV or less. Particularly, the landing energy of the primary electrons on the sample may be 30 keV or more, or 50 keV or more. A high particle energy of the charged particle beams may be beneficial for beam penetration through surrounding material or into deep sample holes or structures.

Moreover, for imaging complex sample structures, detection of signal electrons with high particle energies may be beneficial, e.g. particle energies of 1 keV or more, or 30 keV or more. These high-energy signal electrons may escape from larger sample depth and may penetrate through sample structures. In particular, detection of the backscattered electrons (BSE) may be advantageous, because BSEs may have higher energies than secondary electrons (SEs) generated at the sample.

In a second example, the multi-beam lens device according to embodiments described herein can be used in combination with a beam deflector device, e.g. upstream from or downstream from a beam separator. Beam separators can be realized by one or more beam deflectors, e.g. electrostatic, magnetic or combined electrostatic-magnetic beam deflectors. In order to keep the aberrations of the beam deflectors small, it may be beneficial to keep the deflection angles small. As a consequence, also spatial separation of multiple charged particle beams may be small which leads to mechanical design challenges with view to multi-beam lenses before or behind beam deflector devices such as beam separators.

As the multi-beam lens device according to embodiments described herein may be particularly compact and low in aberrations, the multi-beam lens device may be used for focussing a multiple charged particle beam into at least one of a beam deflector device, a beam switch device and a beam separator device to a common spot X, e.g. to a common spot located at a center of a beam separator.

According to some embodiments described herein, a charged particle beam device with a beam separator is provided, which includes a multi-beam lens device upstream from the beam separator for focussing multiple charged particle beams to a common spot. The beam separator may be configured for separating secondary charged particles from primary charged particles. In some embodiments, the beam separator may be part of a mirror corrector device and be configured for separating compensated charged particle beams from primary charged particle beams. In some embodiments, a multi-beam lens device according to embodiments described herein may be provided upstream from a beam deflector device.

Figure 2:
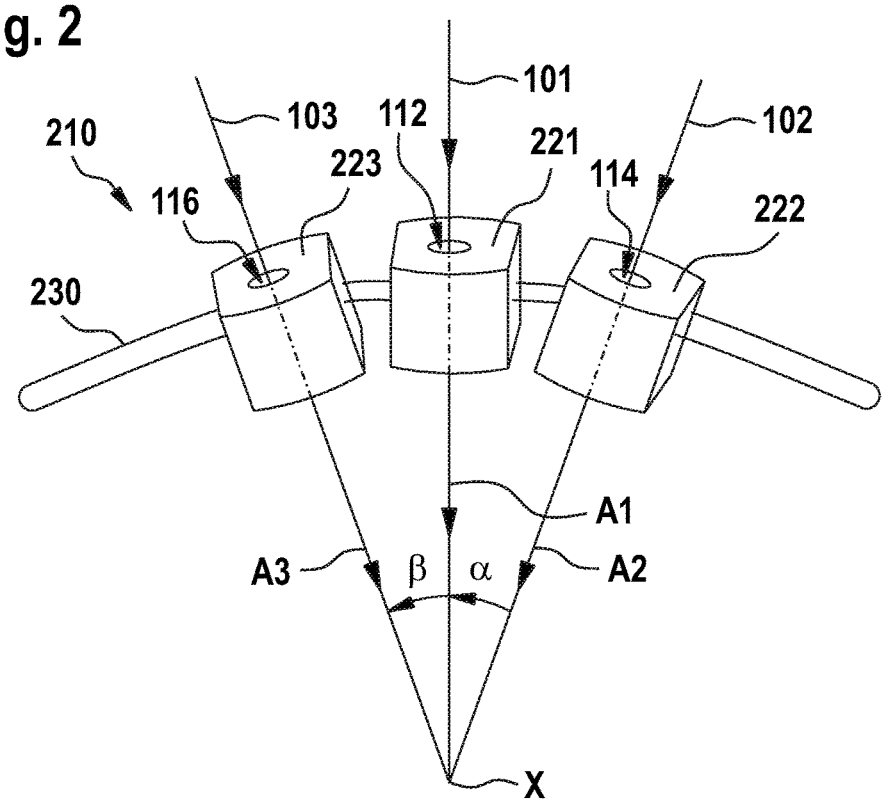
FIG. 2 shows a multi-beam lens device according to embodiments described herein in a schematic view.

FIG. 2 shows a multi-beam lens device 210 according to embodiments described herein in a schematic view. The multi-beam lens device 210 includes a first body part 221 with a first beam passage 112 for a first charged particle beam 101, a second body part 222 with a second beam passage 114 for a second charged particle beam 102, and a third body part 223 including a third beam passage 116 for a third charged particle beam 103. Further beam passages for further charged particle beams may be provided.

In some embodiments, the first, second, and third beam passages are configured as bores or openings extending through the respective body parts in a radial direction with respect to the common spot X. In some embodiments, the multi-beam lens device may include only two body parts, or four or more body parts. In some embodiments, two or more body parts may have a corresponding shape.

The first direction of the first beam passage 112 may be inclined with respect to the second direction of the second beam passage 114 by an angle $\alpha$ of 15° or more, e.g. 35°, and with respect to the third direction A3 of the third beam passage 116 by an angle $\beta$ of 15° or more, e.g. 35°. In some embodiments, the angle $\alpha$ may correspond to the angle $\beta$. For example, the second and third beam passages may extend symmetrically with respect to the first beam passage. Alternatively or additionally, all beam passages may extend in a single propagation plane. Such a setup is illustrated in FIG. 2. In other embodiments, the beam passages may extend in two, three or more different propagation planes.

In some embodiments, which may be combined with other embodiments described herein, the body parts may be provided as separate components. This has the advantage that the tilting angles between the individual body parts may be adjusted as appropriate by tilting the body parts with respect to each other as needed. For example, when each body part is provided with an opening defining a beam passage, the tilting angles between all beam passages may be adjusted as appropriate.

In some embodiments, a curvature of an inlet surface of the multi-lens device in which the beam inlets are formed is convex, i.e. the overall shape of the inlet surface is convex. For example, the first body part 221 may have a first inlet surface and the second body part 222 may have a second inlet surface, wherein the first inlet surface may be inclined with respect to the second inlet surface by the angle $\alpha$ (5° or more and 60° or less) such that a convex inlet surface is formed. Accordingly, in some embodiments, a curvature of an outlet surface of the multi-lens device in which the beam outlets are formed is concave, i.e. the overall shape of the outlet surface is concave.

A particularly compact arrangement of the multi-beam lens device which is easy to handle may include two, three or more body parts which are arranged in a propagation plane around the common spot X such that the openings provided in the body parts extend in a radial direction with respect to the common spot X. The body parts may be provided at an equal spacing. Corresponding tilting angles between adjacent body parts may be provided, respectively.

The first body part 221, the second body part 222, and the third body part 223 may be connected by a common excitation coil 230. The common excitation coil 230 may be formed as a closed loop which extends around all beam passages. The body parts may be provided with coil openings for passing the common excitation coil 230 through the body parts. The coil openings may extend essentially perpendicular with respect to the beam passages through the body parts. In some embodiments, the common excitation coil 230 may have an elongated shape as indicated in FIG. 2 so that the body parts are connected by the common excitation coil 230 in a curved row. For example, in a top view, the common excitation coil may have the shape of a rectangle with rounded edges, while, in the side view of FIG. 2, the common excitation coil may have a curved shape such as the shape of a circular arc.

In the embodiment shown in FIG. 2, the body parts are essentially shaped as cuboids, blocks or cubes. However, other shapes are possible. For example, the body parts may have a round or circular sectional shape, and may be essentially cylindrical. In some embodiments, each body part may include a first pole piece and a second pole piece.

Figure 3:
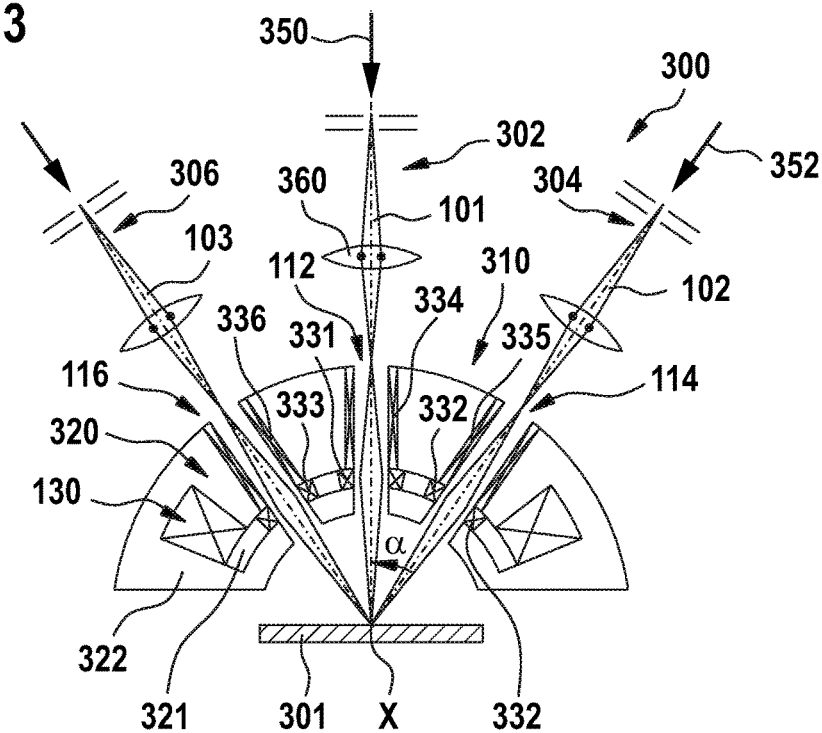
FIG. 3 shows a charged particle beam device with a multi-beam lens device according to embodiments described herein in a schematic sectional view.

FIG. 3 shows a charged particle beam device 300 in a schematic sectional view. The charged particle beam device 300 includes an objective lens which is configured as a multi-beam lens device 310 according to embodiments described herein. The multi-beam lens device 310 can additionally or alternatively be arranged at other positions in the charged particle beam device, e.g. upstream from or downstream from a beam deflector device, as is explained above in more detail. The multi-beam lens device 310 is similar to the multi-beam lens device 110 shown in FIG. 1 so that reference can be made to the above explanations which are not repeated here.

The multi-beam lens device 310 includes a first beam passage 112 for a first charged particle beam 101, a second beam passage 114 for a second charged particle beam 102, and a third beam passage 116 for a third charged particle beam 103. The first beam passage 112 extends between a first beam inlet and a first beam outlet along a first direction, the second beam passage 114 extends between a second beam inlet and a second beam outlet along a second direction, and the third beam passage 116 extends between a third beam inlet and a third beam outlet along a third direction. The relative angle between two adjacent directions may be 5° or more, particularly 15° or more, more particularly 25° or more, or even about 35° or more, respectively. In other embodiments, only two beam passages or more than three beam passages may be provided.

The charged particle beam device 300 further includes a first column 302 configured to guide the first charged particle beam 101 toward the first beam inlet, a second column 304 configured to guide the second charged particle beam 102 toward the second beam inlet, and a third column 306 configured to guide the third charged particle beam 103 toward the third beam inlet.

A "column" as used herein may refer to an arrangement for providing a charged particle beam, e.g. an electron beam, and guiding the charged particle beam along an optical axis. In some embodiments, a column may also include a charged particle beam source for generating a charged particle beam, e.g. an electron source. In other embodiments, two or more columns may be supplied with charged particle beams from a single charged particle beam source.

In some embodiments, which may be combined with other embodiments described herein, each column may have an own charged particle beam source, e.g. an electron source. In some embodiments, each column may have a condenser lens system 360. At least one of the charged particle beam sources may be a high brightness electron source.

For example, as is shown in FIG. 3, the first column 302 may include a first charged particle beam source 350 for generating the first charged particle beam 101, and the second column 304 may include a second charged particle beam source 352 for generating the second charged particle beam 102. Each charged particle beam source may be a high brightness electron source, e.g. a cold field emission (CFE) source or a thermal field emission (TFE) source. In particular, a CFE source may be advantageous due to the high brightness, the small virtual source size, which may be in the lower nanometer range, and the small energy width of a few tens of eV.

Figure 6:
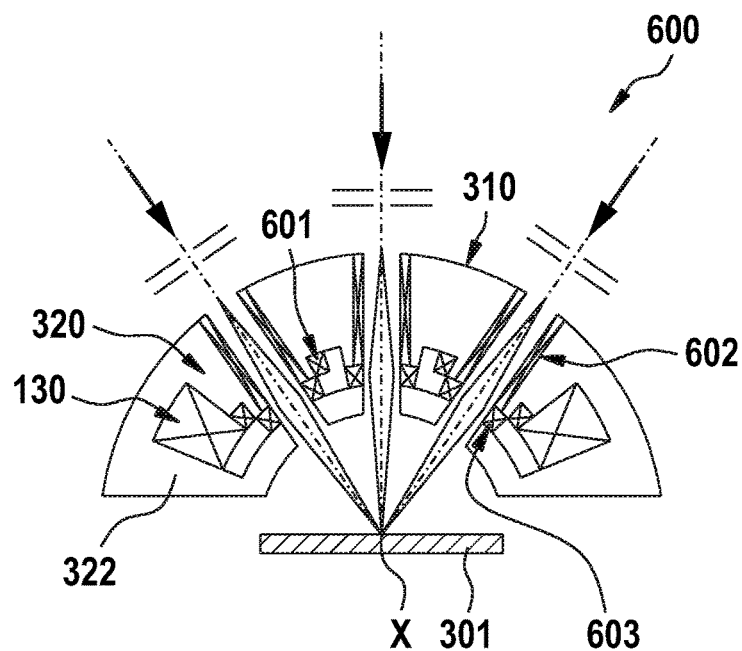
FIG. 6 shows a charged particle beam device with a multi-beam lens device according to embodiments described herein in a schematic sectional view.

When CFE sources are used, a simple column architecture can be realized which may skip the condenser lens system, because the virtual source can be directly imaged on the sample resulting in nanometer resolution. In FIG. 3, each column is provided with a charged particle beam source and a condenser lens system 360. FIG. 6 shows a charged particle beam device with three columns, each column including a high brightness electron source which may be directly imaged on the sample, without providing condenser lens systems.

In some embodiments, which may be combined with other embodiments described herein, at least one column may additionally or alternatively include a charged particle beam source configured for generating a flooding beam. A flooding beam as used herein may be understood as a charged particle beam for removing surface charges from a surface of the sample and/or for pre-charging the surface of the sample. In some embodiments, the flooding beam may not be configured to be finely focussed on the common spot, but may be configured for illuminating an area of interest on the sample with a high current. In some embodiments, the flooding beam is not focussed at all, or only slightly focussed, as appropriate. In some embodiments, at least one column may be provided with a high current charged particle beam source, particularly a high current electron source, for generating the flooding beam, whereas some or all other columns may be provided with a high brightness electron source.

Illumination area definition for the flooding beam can be achieved by different hardware configurations, e.g. by at least one of (i) providing a specific charged particle beam path, e.g. by changing the excitation of one or more condenser lenses, (ii) providing a specific pole piece geometry in the multi-beam lens device for at least one charged particle beam, i.e. for the flooding beam, e.g. by providing a different shape or geometry of the respective beam passage, beam inlet, beam outlet, opening in the lens body and/or focussing geometry, (iii) changing the excitation of a fine focus lens of the flooding beam.

In the embodiment shown in FIG. 3, the first beam passage 112 is configured for perpendicular incidence of the first charged particle beam 101 on a surface of a sample 301. Therein, the first direction and the first beam passage 112 may extend essentially perpendicular with respect to the surface of the sample 301, i.e. along a main optical axis of the multi-beam lens device 310.

The second beam passage 114 may be configured for tilted incidence of the second charged particle beam 102 on the surface of the sample 301, e.g. at an angle of 35° as compared to a perpendicular direction of incidence, and/or the third beam passage 116 may be configured for tilted incidence of the third charged particle beam 103 on the surface of the sample, e.g. at an angle of 35° as compared to a perpendicular direction of incidence. Therein, the second and third beam passages may extend symmetrically with respect to the first beam passage.

In some embodiments, all beam passages may be configured for tilted incidence, e.g. at an angle of 15° or more with respect to a direction of perpendicular incidence on the sample surface, whereas no column for perpendicular incidence may be provided. In some embodiments, the second direction, the third direction and/or further directions of further beam passages may be inclined with respect to the first direction and/or with respect to each other by an angle of 15° or more, respectively. In some embodiments, the first, second, third and/or further beam passages may extend in the same propagation plane. In other embodiments, two, three or more beam passages may extend in different propagation planes. In some embodiments, the beam passages may have non-symmetrical angular inclinations. In some embodiments, all beam passages may extend in a radial direction with respect to the common spot X on the sample.

According to some embodiments described herein, three-dimensional information about the sample 301 may be obtained by imaging the sample with multi-beams targeting a single spot on the target from different directions.

As is shown in FIG. 3, in some embodiments described herein, the multi-beam lens device 310 may include a lens body 320 with a first opening defining the first beam passage 112, a second opening defining the second beam passage 114, and a third opening defining the third beam passage 116. Further openings for further charged particle beams may be provided. All openings may extend in a radial direction with respect to the common spot X on the sample 301.

In some embodiments, the lens body 320 may be at least partially formed as a section of a cylinder wall 322 extending at least partially around the common spot X. The openings defining the beam passages may extend through the cylinder wall in a radial direction, e.g. in the same sectional plane, which is shown in FIG. 3.

The cylinder wall 322 may be at least partially hollow so that a coil accommodation space for the common excitation coil 130 may be formed in the cylinder wall 322. The common excitation coil 130 may extend around all beam passages in a circumferential direction and may form a closed loop. The magnetic field generated by the common excitation coil 130 may act on the charged particle beams in the region of a gap 321 provided between an upper pole piece and a lower pole piece, respectively.

In some embodiments, which may be combined with other embodiments described herein, the multi-beam lens device 310 may include a scan deflector system for individually scanning the charged particle beams over the surface of the sample 301, e.g. an x- and/or a y-direction scan deflector system. In some embodiments, the scan deflector system may include a first deflector device 331 for individually deflecting the first charged particle beam 101, a second deflector device 332 for individually deflecting the second charged particle beam 102, and/or a third deflector device 333 for individually deflecting the third charged particle beam 103. The deflector devices may be x- and y-direction scan deflector devices. For example, the deflector devices may be used for scanning a charged particle beam in an arbitrary scanning direction over the surface of the sample 301. The deflector devices may be magnetic, electrostatic or combined electrostatic magnetic deflector devices. In the embodiments shown in FIG. 3, a deflector device is provided inside each of the openings which define the beam passages.

In some embodiments, which may be combined with other embodiments described herein, the multi-beam lens device 310 may include at least one alignment system and/or aberration correction system for individually aligning and/or correcting the charged particle beams propagating through the multi-beam lens device 310. For example, at least one electrostatic or magnetic multipole device may be provided for correcting beam aberrations of the charged particle beams.

As is shown in FIG. 3, in some embodiments, a first multipole device 334 may be provided for influencing the first charged particle beam 101, a second multipole device 335 may be provided for influencing the second charged particle beam 102, and a third multipole device 336 may be provided for influencing the third charged particle beam 103. The multipole devices can be magnetic, electrostatic or combined electrostatic magnetic multipole devices. An electrostatic multipole device, e.g. a quadrupole device or an octupole device, may be configured for deflecting, aligning and/or for correcting a charged particle beam. In some embodiments, the multipole devices may be located inside the openings defining the beam passages, e.g. upstream from deflector devices for scanning the charged particle beams.

FIG. 3 shows a charged particle beam device 300 with three columns for three charged particle beams, wherein the first beam passage 112 is configured for perpendicular incidence on the sample 301, and the second and third beam passages are configured for inclined incidence at, e.g., +/−35° with respect to the perpendicular direction of incidence. Other configurations are possible.

In some embodiments, which may be combined with other embodiments described herein, the columns may extend in the direction of the respective beam passages. For example, as is shown in FIG. 3, the first column 302 may extend in the first direction, the second column 304 may extend in the second direction, and the third column 306 may extend in the third direction. For example, each charged particle beam may propagate essentially linearly from the respective beam source toward the multi-beam lens device 310, and further along the respective beam passage toward the sample 301. In other words, the columns may extend in a radial direction with respect to the common spot X, respectively. This may be beneficial, as additional beam deflectors for deflecting the charged particle beams along the directions of the beam passages may be avoided. Beam aberrations may be kept small. In particular, the charged particle beams may propagate along essentially straight optical axes through the charged particle beam device from the source to the sample.

Figure 4:
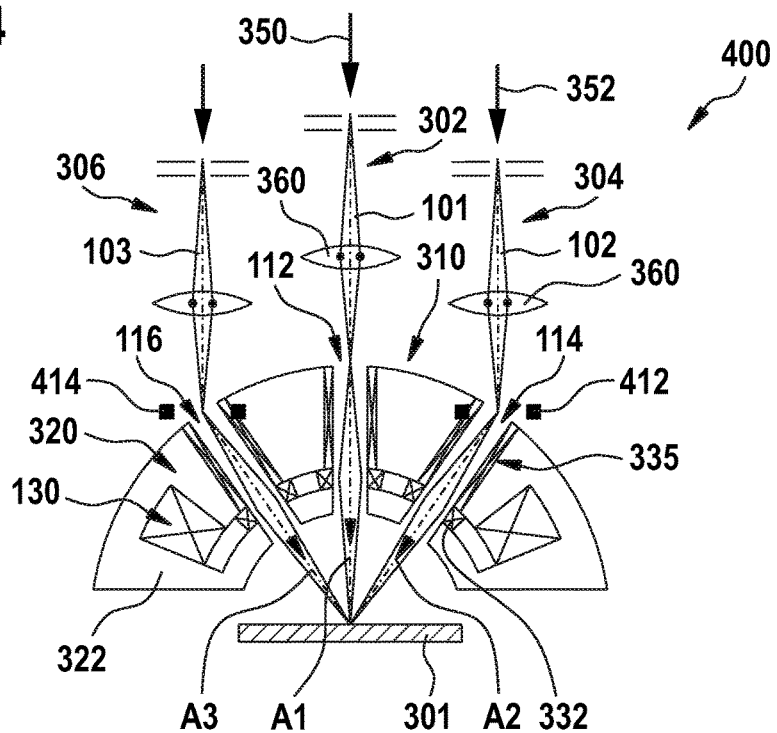
FIG. 4 shows a charged particle beam device with a multi-beam lens device according to embodiments described herein in a schematic sectional view.

FIG. 4 shows a charged particle beam device 400 with a multi-beam lens device 310 which essentially corresponds to the charged particle beam device 300 shown in FIG. 3, so that reference can be made to the above explanations which are not repeated here. Differences with respect to the embodiment of FIG. 3 will be explained.

The charged particle beam device 400 includes a first column 302, a second column 304, and a third column 306 which extend essentially parallel with respect to each other, particularly in a direction of perpendicular incidence on the sample. Therein, the first charged particle beam 101, the second charged particle beam 102, and the third charged particle beam 103 may propagate essentially parallel to each other through the columns from the respective charged particle beam sources toward the multi-beam lens device 310.

The first column 302 may be configured for providing the first charged particle beam 101 for perpendicular incidence on the sample 301, wherein the first charged particle beam 101 may propagate along a straight optical axis from the first charged particle beam source 350 through the first column 302 and along the first direction A1 through the multi-beam lens device 310 toward the sample 301.

In some embodiments, at least one column includes a deflector for deflecting the respective charged particle beam toward the multi-beam lens device 310 along the direction of the respective beam passage. For example, as is shown in FIG. 4, the second column 304 may include a first deflector 412 for deflecting the second charged particle beam 102 along the second direction A2, and the third column 306 may include a second deflector 414 for deflecting the third charged particle beam 103 along the third direction A3. In other words, at least one column may be tilted with respect to the associated beam passage, so that a deflection of the charged particle beam upstream from the multi-beam lens may be appropriate.

The charged particle beam device 400 of FIG. 4 with parallel columns may be more compact than the charged particle beam device 300 of FIG. 3, as the columns may be arranged in closer vicinity with respect to each other. For example, in the embodiments of FIG. 4, a distance between the first charged particle beam source 350 and the second charged particle beam source 352 may be 1 cm or more and 20 cm or less, particularly 3 cm or more and 8 cm or less. In some embodiments, all columns may be included in a single housing, e.g. a single cylindrical housing. Further architectural advantages are available.

The first deflector 412 and the second deflector 414 may be 1-stage deflectors or 2-stage deflectors. Beam aberrations can be kept small. In some embodiments, which may be combined with other embodiments described herein, a crossover of the charged particle beam may be located in the pivot point of the first deflector 412 and/or the second deflector 414. For example, at least one condenser lens system 360 may be configured for focussing a charged particle beam such that a crossover of the charged particle beam is located in the center of one of the deflectors.

In some embodiments, the deflector for deflecting the charged particle beam along the direction of the corresponding beam passage may be a magnetic or a combined electrostatic and magnetic deflector. Also electrostatic deflectors are possible.

Figure 5:
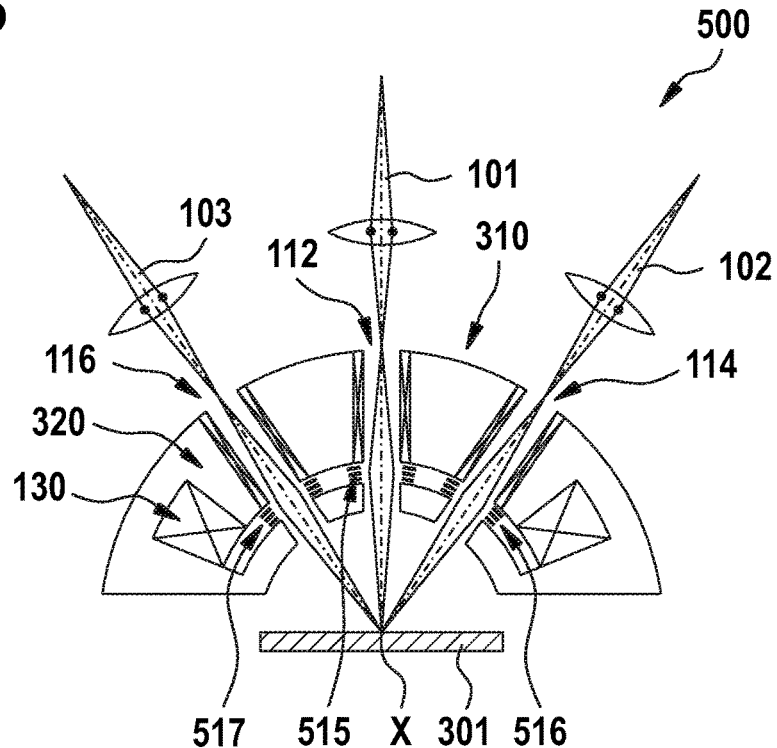
FIG. 5 shows a charged particle beam device with a multi-beam lens device according to embodiments described herein in a schematic sectional view.

FIG. 5 shows a charged particle beam device 500 with a multi-beam lens device 310 which essentially corresponds to the charged particle beam device 300 shown in FIG. 3, so that reference can be made to the above explanations which are not repeated here. Differences with respect to the embodiment of FIG. 3 will be explained.

In some embodiments, which can be combined with other embodiments described herein, the multi-beam lens device 310 may include at least one fine focussing device for individually focussing at least one of the charged particle beams. For example, as is shown in FIG. 5, a first electrostatic lens device 515 may be provided for focussing the first charged particle beam 101, a second electrostatic lens device 516 may be provided for focussing the second charged particle beam 102, and a third electrostatic lens device 517 may be provided for focussing the third charged particle beam 103.

The common excitation coil 130 may be configured for a coarse focussing of the charged particle beams, and the fine focussing devices may be configured for fine focussing of the charged particle beams. Focussing accuracy can be increased. Further, all charged particle beams can be reliably focussed to the common spot X, when appropriate.

At least one fine focussing device may be configured as an electrostatic Einzel-lens. Therein, at least one electrode of the electrostatic Einzel-lens can be configured as an electrostatic multipole electrode, e.g. a quadrupole or octupole electrode, which may additionally allow beam deflection and beam stigmatism. In the embodiments shown in FIG. 5, an electrostatic Einzel-lens is arranged in each of the openings, wherein a center electrode of each electrostatic Einzel-lens may be configured as an electrostatic multipole electrode. Other arrangements are possible.

In some embodiments, additionally or alternatively at least one electrostatic or magnetic scan deflector device may be provided for individually deflecting the charged particle beams. In some embodiments, additionally or alternatively at least one magnetic corrector device may be provided for individually correcting the charged particle beams.

FIG. 6 shows a charged particle beam device 600 with a multi-beam lens device 310 which essentially corresponds to the charged particle beam device 300 shown in FIG. 3, so that reference can be made to the above explanations which are not repeated here.

In some embodiments, which may be combined with other embodiments described herein, the multi-beam lens device 310 may include at least one fine focus coil 601 for individually focussing at least one of the charged particle beams, particularly more than one fine focus coil for individually focussing two or more charged particle beams. The fine focus coils 601 may be arranged in a fine focus coil accommodation space provided in the lens body, respectively. The fine focus coils 601 may extend around one of the pole pieces, e.g. the upper pole piece, for individually focussing the charged particle beam propagating through the beam passage.

The common excitation coil 130 may be configured for a coarse focussing of all charged particle beams to the common spot X, and the fine focus coils 601 may be configured for fine focussing the charged particle beams individually.

Focussing accuracy can be increased. Further, all charged particle beams can be reliably focussed to the common spot X, when appropriate.

In some embodiments, additionally or alternatively at least one electrostatic or magnetic scan deflector device 603 may be provided for individually deflecting the charged particle beams. In some embodiments, additionally or alternatively at least one multipole device 602 may be provided for individually correcting or aligning the charged particle beams. Reference is made to the above explanations.

In the embodiment shown in FIG. 6, a simple architecture is used which does not include condenser lens systems in the columns. Cold field emission electron sources or other high brightness electron sources may be used.

In some embodiments, which may be combined with other embodiments described herein, further optical components may be included in the columns, e.g. one or more beam separators, one or more beam correctors such as mirror corrector devices, one or more alignment deflectors, scan deflectors, and transfer lens systems. In some embodiments, a beam blanker device may be provided. For example, each column may include a beam blanker for individually blanking the charged particle beam propagating through the respective column. The number of beams hitting the sample as well as the desired targeting directions may be individually adjusted by blanking some of the charged particle beams.

For example, the sample can be examined via perpendicular incidence only, by blanking all but the first charged particle beam 101. For example, the sample can be examined via tilted incidence only by blanking at least the first charged particle beam 101. Simultaneous sample inspection from different directions is possible. Further, sample inspection from a single direction is possible. For aligning the individual beam passages and for adjusting individual focussing, blanking one or more of the other charged particle beams may be beneficial.

Figure 7A:
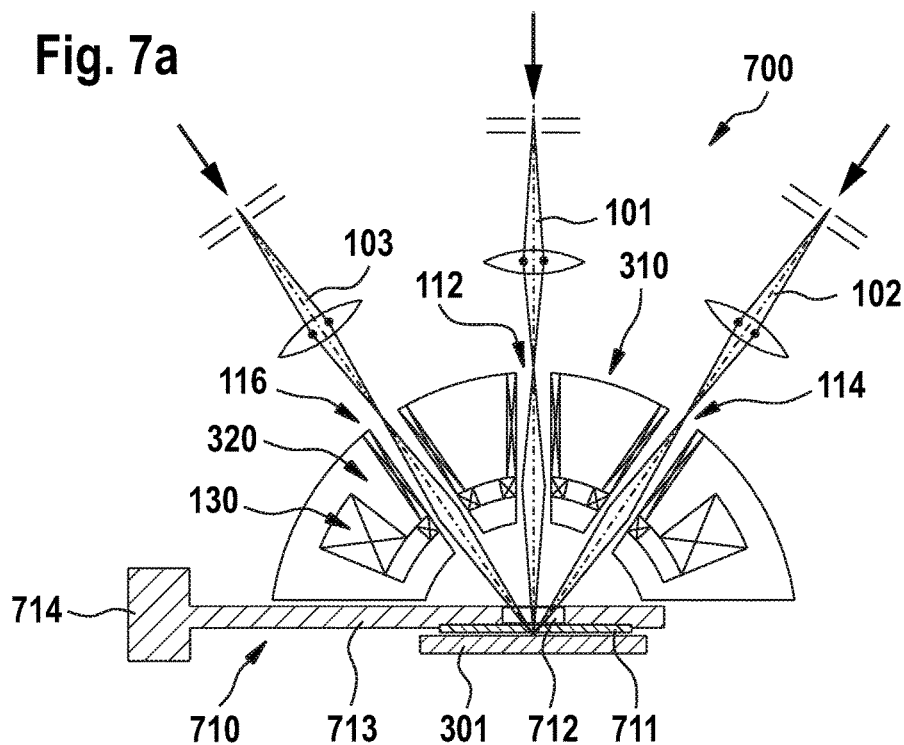
FIG. 7a and FIG. 7b show charged particle beam devices with multi-beam lens devices according to embodiments described herein in a schematic sectional view.
Figure 7B:
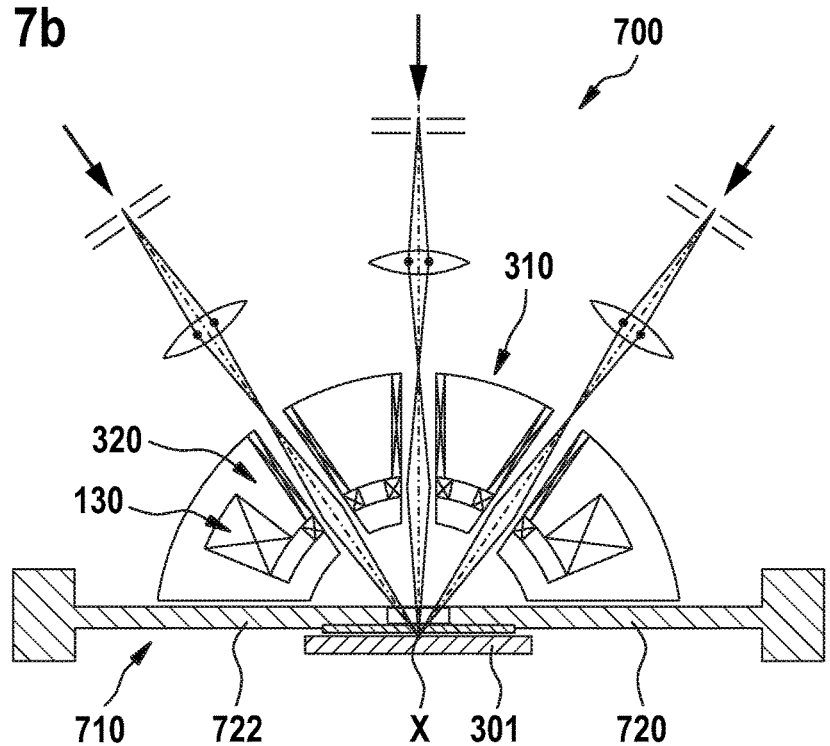

FIG. 7*a* and FIG. 7*b* show a charged particle beam device 700 including a multi-beam lens device 310 which essentially corresponds to the charged particle beam device 300 shown in FIG. 3, so that reference can be made to the above explanations which are not repeated here. The multi-beam lens device 310 can include some or all of the features described above with respect to some or all embodiments described herein.

Similar to the previous embodiments, the multi-beam lens device 310 may be utilized as an objective lens, wherein the sample 301 to be inspected can be targeted from different directions of incidence. For example, perpendicular incidence as well as tilted incidence from various directions may be possible.

For imaging complex sample structures, e.g. bottoms of deep holes, trenches, and structures buried inside a sample, detection of the backscattered electrons (BSE) may be advantageous, because of the higher energy of BSEs (e.g., 1 keV to 100 keV) as compared to secondary electrons (SE) with energies up to about 25 eV. BSEs can both escape from larger sample depth and can penetrate surrounding materials. Good signals from three dimensional or complex sample structures can be obtained. Also imaging of overlay structures may be possible.

With a charged particle beam device according to embodiments described herein, three dimensional information and depth information may be made available. In some embodiments, images may be generated with charged particle beams having different primary electron energies which may lead to different penetration depths in the sample. A tomography of the sample may be possible by analysing the detected signals while varying one or more of the primary electron energy and the landing energy on the sample (e.g. in the range from 1 keV to 100 keV) and while targeting the sample from different angles of incidence.

In accordance with embodiments described herein, a charged particle beam device 700 is provided for generating three dimensional information from backscattered electrons generated by multiple tilted incident charged particle beams.

In some embodiments, which may be combined with other embodiments described herein, the charged particle beam device 700 may include at least one detector arrangement 710 which is configured for directly or indirectly detecting electrons backscattered from the sample (BSEs).

In some embodiments, the detector arrangement 710 may be configured for detecting only electrons having an energy above a predetermined energy threshold. For example, the detector arrangement may be configured for detecting electrons having an energy of 100 eV or more, particularly 1 keV or 3 keV or more. The detector arrangement may be configured for detecting BSEs, whereas SEs may not be detected or may be detected to a lesser degree due to their lower particle energy.

In some embodiments, which may be combined with other embodiments described herein, the detector arrangement 710 may be a scintillation detector including at least one scintillator 711. The scintillator 711 may be configured for at least detecting electrons having energies of 1 keV or more so that only BSEs may be detected, when appropriate.

The scintillator 711 may be coupled to a light guide 713 configured for guiding the photons generated by the signal electrons to a light sensor, e.g. including a photomultiplier 714 or a photodiode.

In FIG. 7*a*, a 1-channel detector arrangement 710 is shown detecting essentially all emission angles. The detector arrangement may be provided at some distance (e.g. between 1 mm and 10 mm) above the sample 301, wherein an opening 712 may be provided in the detector arrangement 710 for the charged particle beams to propagate through the detector arrangement to hit the sample 301.

In FIG. 7*b*, a charged particle beam device with a detector arrangement 710 including a first detector segment 720 and at least one second detector segment 722 is shown. Hemispherical detection of signal electrons is possible. In some embodiments, the detector arrangement 710 may include a higher segmentation, e.g. for quadrant detection.

In some embodiments, each detector segment may include one or more of a scintillator, a light guide, and a photon multiplier.

Figure 8A:
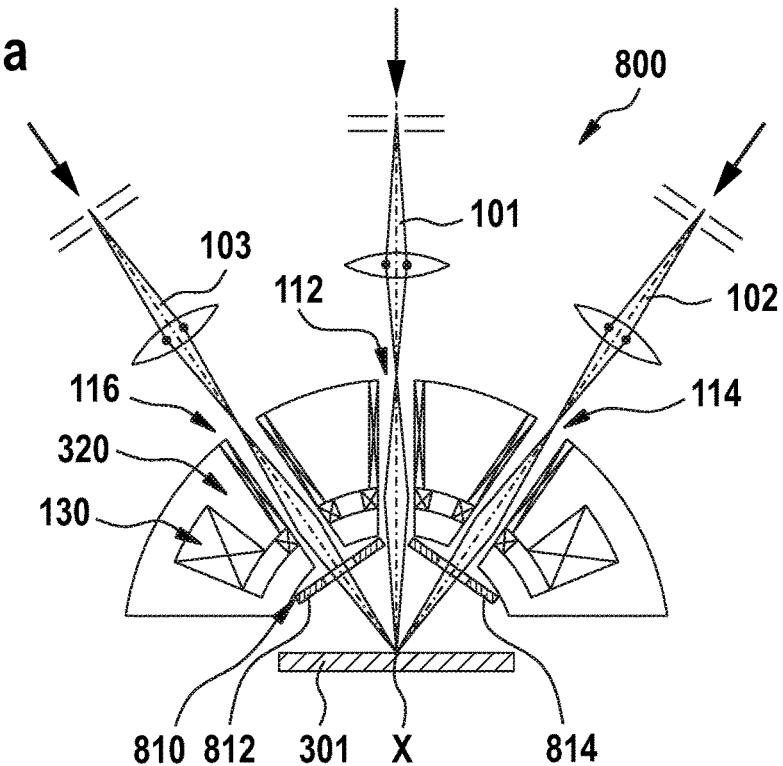
FIG. 8a, FIG. 8b, and FIG. 8c show charged particle beam devices with multi-beam lens devices according to embodiments described herein in a schematic sectional view.
Figure 8B:
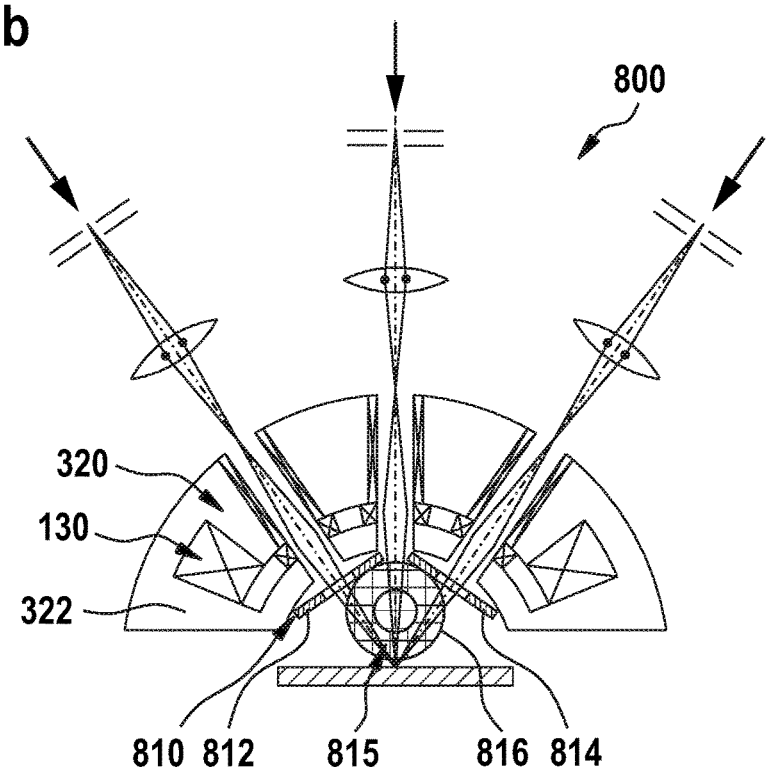
Figure 8C:
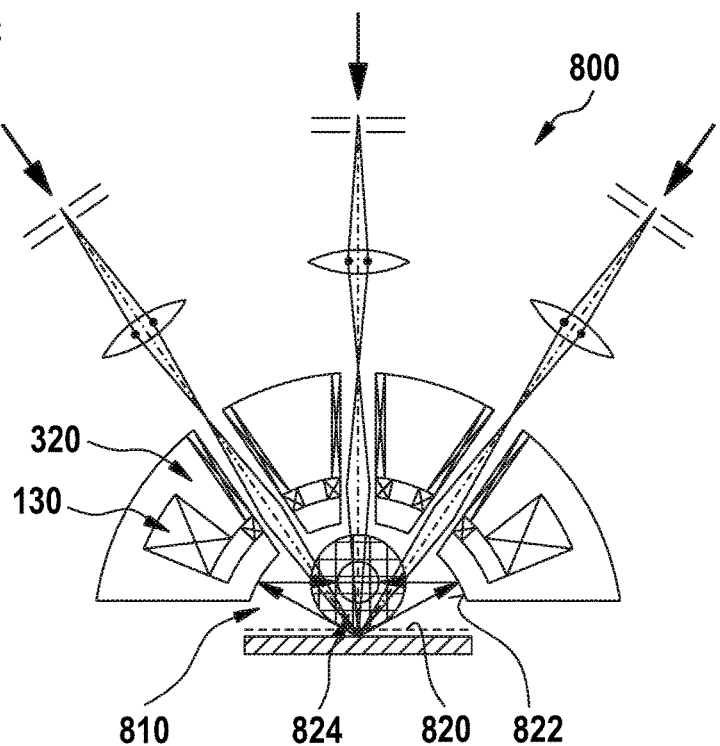

FIG. 8*a*, FIG. 8*b*, and FIG. 8*c* show charged particle beam devices 800 including a multi-beam lens device 310 which essentially corresponds to the charged particle beam device 700 shown in FIG. 7*a*, so that reference can be made to the above explanations which are not repeated here. The multi-beam lens device 310 can include some or all of the features described above with respect to some or all embodiments described herein.

The charged particle beam device 800 may include at least one detector arrangement 810 which is configured for directly or indirectly detecting electrons backscattered from the sample (BSEs). In some embodiments, the detector arrangement 810 may be configured for detecting electrons having an energy above a predetermined energy threshold. The detector arrangement 810 may be configured for detecting BSEs, whereas SEs may not be detected or may be detected to a lesser degree due to their lower particle energy.

The detector arrangement 810 may include at least one pin diode 812. A single pin diode may be provided or, alternatively, two or more pin diodes may be provided for hemispherical or quadrant detection.

In the embodiments shown in FIG. 8*a* and FIG. 8*b*, a pin diode 812 with an opening for a first charged particle beam is provided for detecting BSEs backscattered into a first hemisphere, and a second pin diode 814 with an opening for a second charged particle beam is provided for detecting BSEs backscattered into a second hemisphere. More than two pin diodes may be provided, e.g. four pin diodes for quadrant detection.

The configuration of the detector arrangement 810 of FIG. 8*a* and FIG. 8*b* including pin diodes is particularly compact, because no light guides may be provided. Light guides can be space-consuming and can cause signal losses.

As is shown in FIG. 8*b*, the detector arrangement 810 may additionally or alternatively include at least one further detector 815 which may extend perpendicular to the sectional plane of FIG. 8*b*. In particular, when the lens body 320 is configured as a part of a cylinder wall 322, free space for the at least one further detector 815 may be present in a direction of a cylinder axis of the cylindrical wall. In some embodiments, the cylinder axis may extend through the common spot X.

In some embodiments, at least one further detector 815 of the detector arrangement 810 may be configured as a scintillator with a biased entry grid 816 and post-acceleration which enables not only detection of backscattered electrons, but also detection of secondary electrons.

The biased entry grid 816 of the at least one further detector 815 may be set on a voltage for primarily attracting secondary electrons (SEs) emitted from the sample, e.g. electrons with particle energies below 100 eV or below 25 eV. BSEs may be primarily detected by the pin diodes due to their high particle energy. The SEs having propagated through the biased entry grid 816 may be post-accelerated in a direction perpendicular to the propagation plane of the charged particle beams (perpendicular to the sectional plane of FIG. 8*b*). Then the SEs may be detected by a scintillator.

Detection of secondary electrons may be helpful in navigation and for aligning the charged particle beam device, because of the higher signal strength as compared to BSEs. After sample location is chosen and/or after alignment of the sample and of the charged particle beam device, BSE tomography can start.

In some embodiments, which can be combined with other embodiments described herein, the detector arrangement may be adjustable for at least one of SE detection only, e.g. via further detector 815, BSE detection only, e.g. via at least one pin diode 812 or scintillator 711, and combined SE and BSE detection, e.g. by simultaneous detection via a further detector 815 and via at least one pin diode, e.g. pin diode 812 of FIG. 8*b*.

Additionally or alternatively, the detector arrangement may include at least one of a filter grid 820 adjustable for preventing penetration of secondary electrons emitted from the sample 301 with an energy below a threshold value, a converter 822 configured for converting backscattered electrons to tertiary electrons, and a tertiary electron detector 824 configured for detecting tertiary electrons.

For example, as is shown FIG. 8*c*, a filter grid 820 may be arranged between the sample and the multi-beam lens device for preventing or attenuating penetration of secondary electrons generated at the sample, e.g. of electrons with an energy below 25 eV, toward the multi-beam lens. Primarily or only BSEs may penetrate the filter grid 820. In some embodiments, the BSEs can be detected with a BSE detector arrangement as specified above.

In some embodiments, a converter 822 for converting BSEs having propagated through the filter grid 820 to low-energy tertiary electrons (TEs) may be provided. For example, tertiary electrons may be generated at an outlet surface of the multi-beam lens device 310 or at an additional electrode with a high electron conversion factor which may be arranged between the filter grid 820 and the multi-beam lens device 310. For example, a converter 822 with a conversion electrode may be attached to an outlet surface of the multi-beam lens device 310. The generated TEs which may have an energy in the range of several eV up to several tens of eV may be detected by a tertiary electron detector 824.

The tertiary electron detector 824 may be designed similar to the further detector 815 of the embodiments of FIG. 8*b*. For example, the tertiary electron detector 824 may include a scintillator with a biased entry grid for attracting electrons, e.g. tertiary electrons, and post-acceleration toward the scintillator.

Depending on the voltage of the filter grid 820, at least one of SEs, BSEs, and both SEs and BSEs emitted from the sample may be detected. For SE detection, the filter grid 820 may be at sample potential or slightly positive so that SEs can penetrate the filter grid 820 and be subsequently detected. The superimposed BSE signal can be neglected because of a significantly smaller signal strength.

Figure 9:
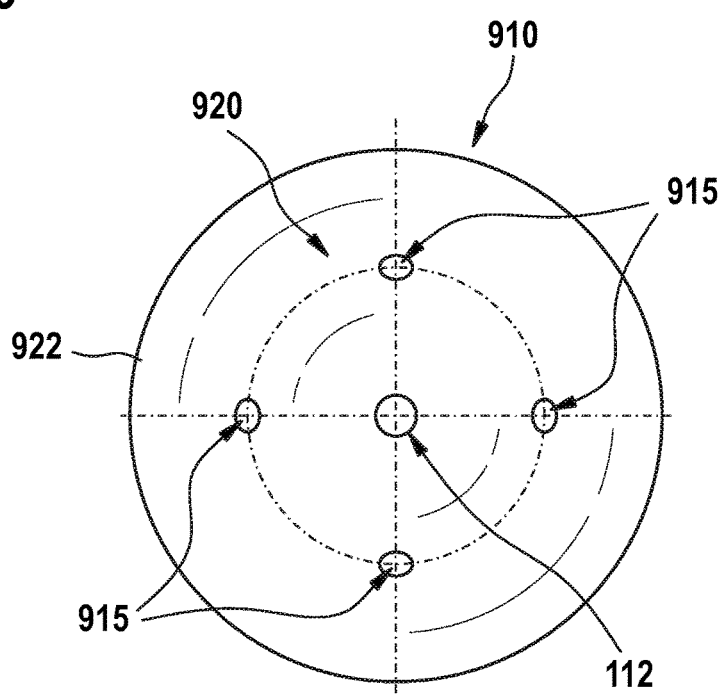
FIG. 9 shows a multi-beam lens device according to embodiments described herein in a schematic top view.

FIG. 9 shows a multi-beam lens device 910 according to embodiments described herein in a schematic top view. In other words, the upstream side of the multi-beam lens device 910 is shown.

The multi-beam lens device 910 includes a first beam passage 112 extending along a first direction from a first beam inlet to a first beam outlet, wherein the beam inlet is exemplarily depicted as a round opening in a lens body 920 of the multi-beam lens device 910. The first beam passage 112 may extend along a main optical axis of the multi-beam lens device and may be configured for perpendicular incidence on a sample.

The multi-beam lens device 910 may further include a plurality of further beam passages 915 extending along further directions through the multi-beam lens device which may be configured for tilted incidence on the sample. Each further beam passage 915 may extend between a beam inlet and a beam outlet through the lens body 920 such that the beam passages approach each other in the direction of the respective beam outlet.

The beam passages may be configured as openings extending through the lens body 920, respectively.

The lens body 920 may be at least partially formed as a section of a spherical wall 922 which may extend at least partially around a common spot X. In some embodiments, the beam passages extend radially toward the common spot X, wherein the common spot X may correspond to a sphere center of the spherical wall 922. The lens body 920 of the multi-beam lens device 910 may include pole-pieces which are formed as sections of a spherical wall.

Accordingly, the charged particle beams propagating along the beam passages through the spherical wall 922 may be directed toward the common spot X from different directions of incidence.

In the embodiment of FIG. 9, an exemplary setup of the beam passages is shown, which includes the first beam passage 112 extending along the main optical axis, whereas each of the further beam passages 915 may extend at an angle α with respect to the first beam passage, which may be 5° or more, particularly 15° or more, more particularly about 35°.

Three, four or more further beam passages 915 may be provided at an equal spacing with respect to each other and/or with respect to the main optical axis so that the common spot X may be inspected from three, four or more directions.

In some embodiments, which may be combined with other embodiments described herein, the further beam passages 915 extend through the spherical wall 922 in a radial direction, respectively, such that the openings defining the further beam passages 915 are arranged on a circular line on an outer surface of the spherical wall. For example, four further beam passages may be provided at angles of 0°, 90°, 180°, and 270° with respect to the main optical axis as indicated in FIG. 9 so that the sample can be inspected from four inclined directions of incidence and from a perpendicular direction of incidence. Other setups are possible.

The spherical setup of the multi-beam lens device 910 shown in FIG. 9 may be utilized for "looking at" the sample from x- and y-directions under different observation angles. The angles and the number of openings in the multi-beam lens device may be freely chosen in a certain range based on the mechanical space available. Therein, the charged particle beams may propagate in at least two different directions of incidence toward the common spot.

A coil accommodation space for accommodating the common excitation coil 130 may be provided in the spherical wall 922 of the lens body 920. The common excitation coil 130 may be provided as a closed loop, e.g. as a circular loop. The common excitation coil may be configured for focusing all charged particle beams. The common excitation coil may run around all charged particle beams in a periphery region of the multi-beam lens device.

The spherical multi-beam lens device of FIG. 9 may include some or all of the further features described above with view to the cylindrical multi-beam lens device. For example, at least one of a fine focus coil, an electrostatic lens device, a magnetic multipole device, an electrostatic multipole device, a scan deflector, a correction device may be provided for influencing one or more of the charged particle beams propagating along the beam passages.

Further, one or more of the detection principles explained with reference to FIGS. 7a to 8c can be implemented in a charged particle beam device 900 with a spherical hedgehog lens, e.g. the multi-beam lens device 910 shown in FIG. 9.

For example, a detector arrangement including at least one of SE-detectors, e.g. scintillators with a biased entrance grids and post-acceleration, BSE detectors for direct or indirect detection of backscattered electrons as explained above, and detectors for SE and BSE detection can be provided.

Figure 10:
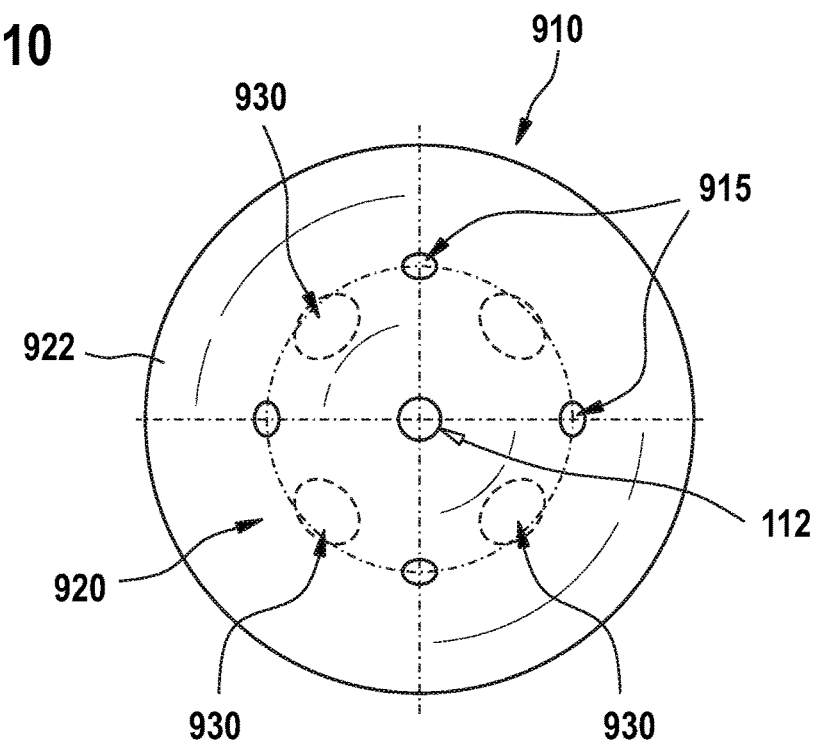
FIG. 10 shows a charged particle beam device with the multi-beam lens device of FIG. 9 in a schematic top view.
Figure 11:
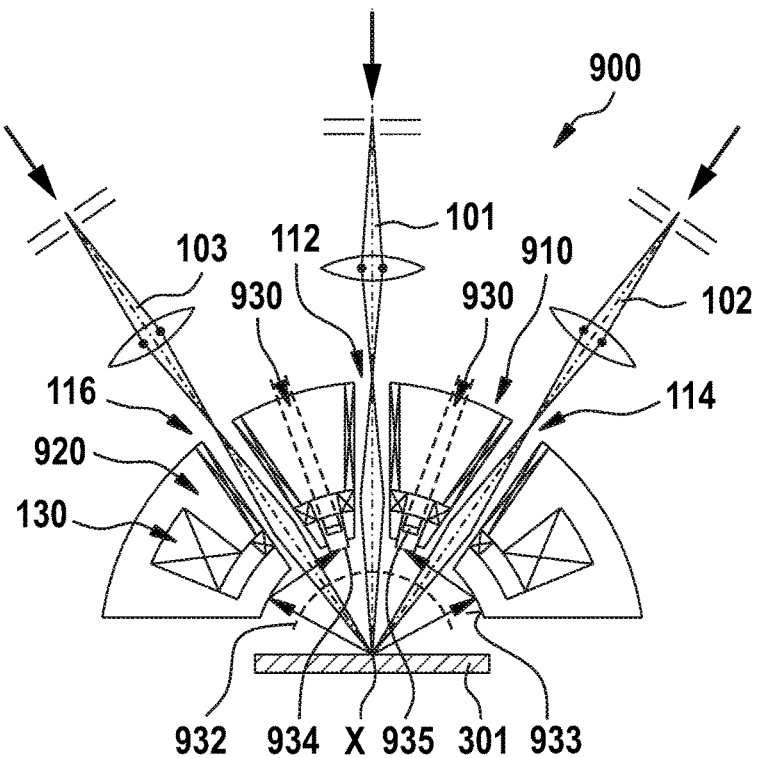
FIG. 11 shows a charged particle beam device with a multi-beam lens device according to embodiments described herein in a schematic sectional view.

FIG. 10 and FIG. 11 show a charged particle beam device 900 which may utilize the multi-beam lens device 910 of FIG. 9 with the spherical setup as an objective lens.

In a spherical setup, the space perpendicular to the sectional plane of FIG. 11 may not be sufficient for arranging a detector. Therefore, it may be advantageous to provide at least one detector having a main extension direction which extends radially with respect to the common spot X. For example, at least one detector may be arranged in the spherical wall 922 of the lens body 920 between two or more beam passages.

In the embodiment shown in FIGS. 10 and 11, a detector 930 may be arranged between each pair of adjacent further beam passages 915, respectively, wherein each detector may extend in a radial direction, as is indicated in FIG. 11. For example, in a setup with four further beam passage 915, four detectors may be provided such that one detector is provided between two adjacent beam passages, respectively. Quadrant electron detection may be possible. In the schematic view of FIG. 11, only two of a total of four detectors 930 are indicated in dashed lines which may lie in a sectional plane different from the sections plane of FIG. 11, as is depicted in FIG. 10. Two detectors may be located behind the paper plane of FIG. 11, and two further detectors may be located before the paper plane of FIG. 11. In other embodiments, less than four detectors may be provided, e.g. two detectors configured for hemispherical detection. In some embodiments, more than four detectors may be provided.

In some embodiments, which may be combined with other embodiments described herein, an at least partially curved filter grid 932 may be provided between the sample 301 and the multi-beam lens device. The curved filter grid 932 may be spherically curved, whereas the filter grid 820 of the embodiment shown in FIG. 8c may be flat. The curved filter grid 932 may be adjustable for preventing penetration of secondary electrons emitted from the sample 301 with an energy below a threshold value. When appropriate, e.g. for alignment purposes, SEs may be allowed to pass through the curved filter grid 932 by modifying the grid voltage.

In some embodiments, the detector 930 may be adjustable for detection of SEs and BSEs, or for detection of BSEs only.

In some embodiments, a converter 933 configured for converting backscattered electrons to tertiary electrons, and a tertiary electron detector 935 configured for detecting tertiary electrons may be provided. For example, tertiary electrons may be generated from BSEs at a lower surface of the multi-beam lens device 910 or at an additional electrode with a high electron conversion factor which may be arranged between the curved filter grid 932 and the multi-beam lens device 910. The generated TEs which may have an energy in the range of several eV up to several tens of eV may be detected by a tertiary electron detector 935.

The tertiary electron detector 935 may be a scintillation detector with an entrance grid 934 and post-acceleration, similar to the further detector 815 of FIG. 8b. However, the post-acceleration direction may not be perpendicular to the plane of incidence (cf. FIG. 8b), but may be a radial direction with respect to the common spot X. The available space in the spherical wall 922 may be used in an advantageous way.

In some embodiments, which may be combined with other embodiments described herein, alternatively or additionally other detectors may be used. For example, another configuration of scintillators and/or pin diodes is possible. Also EDX detectors can be used which are mounted similar to the SE-detector arrangement, i.e. either from an open side in the cylinder version of FIG. 8a or through the pole piece material in the spherical version of FIG. 9.

In some embodiments, pole piece inserts may be provided in the lens body of the multi-beam lens device according to embodiments described herein.

Figure 12:
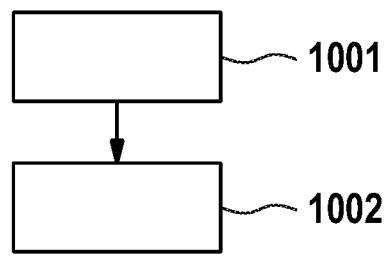
FIG. 12 is a flow diagram illustrating a method of operating a multi-beam lens device according to embodiments described herein.

FIG. 12 is a flow diagram illustrating a method of operating a multi-beam lens device according to any of the embodiments described herein. In box 1001, a first charged particle beam is directed through a first beam passage of the multi-beam lens device along a first direction, and a second charged particle beam is directed through a second beam passage of the multi-beam lens device along a second direction which is inclined by an angle of 5° or more with respect to the first direction such that the first charged particle beam and the second charged particle beam approach each other. In box 1002, a common excitation coil or a common electrode arrangement of the multi-beam lens device is exited such that the first charged particle beam and the second charged particle beam are focussed. In some embodiments, the first charged particle beam and the second charged particle beam are focussed to a common spot.

Exciting may include focussing the first charged particle beam and the second charged particle beam to a common spot on a sample. Accordingly, the multi-beam lens can be used as an objective lens in a charged particle beam device.

In some embodiments, electrons backscattered from the sample are detected in a direct or in an indirect way. Direct detection may include detecting BSEs, e.g. electrons with an energy above a threshold energy, with a scintillation detector or with a pin diode. Indirect detection may include converting BSEs to lower energy electrons, e.g. tertiary electrons, which may be detected via post-acceleration upstream from a scintillation detector or another detector.

Detecting BSEs may include suppressing secondary electrons generated at the sample. In particular, for imaging or inspecting complex structures such as deep holes or buried layers, BSE detection may be beneficial. This is because BSEs may be able to penetrate through surrounding materials and escape from larger sample depth due to their higher particle energy.

In some embodiments, exciting may include focussing the first charged particle beam, the second charged particle beam and at least one third charged particle beam onto a common spot on a sample with a non-planar surface structure.

In some embodiments, the charged particle beams may propagate in at least two planes of incidence and may hit the surface structure of the sample at mutual angles of 15° or more, or 25° or more, respectively, so that the surface structure is targeted from different angles of incidence.

In some embodiments, before focussing the first and second charged particle beams to the common spot, a flooding beam is directed on a surface of the sample for removing surface charges and/or for pre-charging a surface of the sample. The flooding beam may be generated by a high current charged particle beam source. The flooding beam may hit an area of interest of the sample which may be larger than the common spot. For example, the flooding beam may not be finely focussed on the sample, but may hit a larger spot on the sample.

In some embodiments, the multi-beam lens device may include a specific charged particle beam passage for a flooding beam, which may have a geometry different from the remaining beam passages, e.g. a different pole piece geometry. Further, in some embodiments, a flooding beam column with a high current electron source may be provided, wherein the flooding beam column may have a specific geometry, a specific charged particle beam path and/or a specific condenser lens system.

In some embodiments, the method according to embodiments described herein may further include constructing a 3D-image of at least a portion of the non-planar surface structure.

Figure 13:
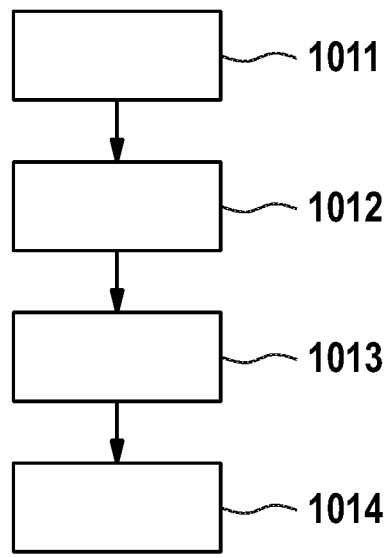
FIG. 13 is a flow diagram illustrating a method of operating a charged particle beam device according to embodiments described herein.

FIG. 13 is a flow diagram illustrating a method of operating a multi-beam lens device according to any of the embodiments described herein.

In box 1011, at least two charged particle beams are generated by at least two charged particle beam sources, e.g. two high brightness electron sources such as thermal field emission (TFE) or cold field emission (CFE) sources.

In box 1012, the charged particle beams are directed toward a multi-beam lens device according to any of the embodiments described herein. In some embodiments, the charged particle beams may be collimated or focussed via condenser lens systems. In some embodiments, at least one charged particle beam may be blanked via a beam blanker. In some embodiments, at least one charged particle beam may be deflected by a deflection angle such that the charged particle beam propagates along the direction of a beam passage of the multi-beam lens. For example, at least one charged particle beam may be deflected by a deflection angle of 5° or more, 15° or more, or 25° or more, toward the direction of a beam passage which radially extends through the multi-beam lens device toward the sample.

In box 1013, the multi-beam lens device may be excited such that the charged particle beams are focussed to a common spot on a sample.

In box 1014, electrons backscattered from the sample are detected. In some embodiments, secondary electrons generated at the sample may be suppressed such that primarily backscattered electrons are detected which may be used for 3D-imaging of the sample.

While the foregoing is directed to specific embodiments, other and further embodiments may be devised without departing from the basic scope thereof, and the scope thereof is determined by the claims that follow.

The invention claimed is:

1. A multi-beam lens device, comprising:
a first beam passage for a first charged particle beam formed along a first direction between a first beam inlet of the first beam passage and a first beam outlet of the first beam passage;
a second beam passage for a second charged particle beam formed along a second direction between a second beam inlet of the second beam passage and a second beam outlet of the second beam passage,
wherein the first direction and the second direction are inclined with respect to each other by an angle of 5° or more such that the first beam passage approaches the second beam passage toward the first beam outlet; and
a common excitation coil or a common electrode arrangement configured for focussing the first charged particle beam and the second charged particle beam to a common spot.

2. The multi-beam lens device of claim 1, wherein the first direction and the second direction are inclined with respect to each other by an angle of 25° or more and 60° or less.

3. The multi-beam lens device of claim 1, comprising a first body part comprising the first beam passage and at least one second body part comprising the second beam passage, wherein the first body part and the second body part are provided as separate components which are connected by the common excitation coil.

4. The multi-beam lens device of claim 1, further comprising a detector for detecting back scattered electrons and/or secondary electrons.

5. The multi-beam lens device of claim 4, further comprising a lens body with a first opening defining the first beam passage and a second opening defining the second beam passage, wherein the first opening and the second opening extend in a radial direction with respect to the common spot.

6. The multi-beam lens device of claim 5, wherein the lens body is at least partially formed as a section of a cylinder wall extending at least partially around the common spot, wherein the first opening and the second opening extend in the same sectional plane in a radial direction through the cylinder wall.

7. The multi-beam lens device of claim 5, wherein the lens body is at least partially formed as a section of a spherical wall extending at least partially around the common spot, wherein the first opening and the second opening extend through the spherical wall in a radial direction.

8. The multi-beam lens device of claim 7, wherein the first opening, the second opening, and at least one third opening, which defines a third beam passage, extend through the spherical wall in a radial direction, respectively, such that the first opening, the second opening and the third opening are arranged on a circular line on an outer surface of the spherical wall.

9. The multi-beam lens device of claim 1, further comprising at least one of a first fine focus coil and a first electrostatic lens device for individually focussing the first charged particle beam, and/or at least one of a second fine focus coil and a second electrostatic lens device for individually focussing the second charged particle beam.

10. The multi-beam lens device of claim 1, further comprising at least one of a first electrostatic multipole device and a first magnetic multipole device for at least one of individually deflecting and correcting the first charged particle beam, and/or at least one of a second electrostatic multipole device and a second magnetic multipole device for at least one of individually deflecting and correcting the second charged particle beam.

11. The multi-beam lens device of claim 1, comprising at least one third beam passage for a third charged particle beam formed along a third direction between a third beam inlet and a third beam outlet, wherein the first beam passage, the second beam passage, and the third beam passage are arranged according to one or more of the following:
the first beam passage extends along a main optical axis of the multi-beam lens device;
the second direction and the third direction are inclined with respect to the first direction and with respect to each other by an angle of 15° or more;
the second beam passage and the third beam passage extend symmetrically with respect to the first beam passage;
the first, second, and third beam passages extend in the same propagation plane; and
the first, second, and third beam passages extend in two or three different propagation planes.

12. A charged particle beam device, comprising:
an objective lens configured as a multi-beam lens device, comprising:
a first beam passage for a first charged particle beam formed along a first direction between a first beam inlet of the first beam passage and a first beam outlet of the first beam passage;
a second beam passage for a second charged particle beam formed along a second direction between a second beam inlet of the second beam passage and a second beam outlet of the second beam passage, wherein the first direction and the second direction are inclined with respect to each other by an angle of 5° or more such that the first beam passage approaches the second beam passage toward the first beam outlet; and
a common excitation coil or a common electrode arrangement configured for focussing the first charged particle beam and the second charged particle beam to a common spot on a sample,
a first column configured to guide the first charged particle beam toward the first beam inlet of the first beam passage; and
at least one second column configured to guide the second charged particle beam toward the second beam inlet of the second beam passage.

13. The charged particle beam device of claim 12, wherein the first column extends parallel with respect to the second column, wherein at least one of the first column comprises a first deflector for deflecting the first charged particle beam along the first direction and the second column comprises a second deflector for deflecting the second charged particle beam along the second direction.

14. The charged particle beam device of claim 12, wherein the first column comprises a first charged particle beam source and the second column comprises a second charged particle beam source.

15. The charged particle beam device of claim 12, further comprising at least one detector arrangement configured for directly or indirectly detecting electrons backscattered from the sample.

16. The charged particle beam device of claim 15, wherein the detector arrangement is adjustable for detection of both secondary electrons and backscattered electrons, and for detection of backscattered electrons only.

17. The charged particle beam device of claim 12, further comprising at least one of a filter grid adjustable for preventing penetration of secondary electrons with an energy below a threshold value, a converter configured for converting backscattered electrons to tertiary electrons, and a detector configured for detecting tertiary electrons.

18. A method of operating a multi-beam lens device, comprising:
directing a first charged particle beam through a first beam passage of the multi-beam lens device along a first direction;
directing a second charged particle beam through a second beam passage of the multi-beam lens device along a second direction which is inclined with respect to the first direction by an angle of 5° or more such that the first charged particle beam and the second charged particle beam approach each other; and
exciting a common excitation coil or a common electrode arrangement for focussing the first charged particle beam and the second charged particle beam to a common spot.

19. The method of claim 18, further comprising:
directly or indirectly detecting electrons backscattered from the sample, while suppressing secondary electrons generated at the sample.

20. The method of claim 18, wherein exciting comprises focussing the first charged particle beam, the second charged particle beam and at least one third charged particle beam to a common spot on a sample with a non-planar surface structure, wherein the first, second, and third charged particle beams propagate in at least two planes of incidence and hit the non-planar surface structure at mutual angles of 15° or more, respectively, the method further comprising:
constructing a 3D-image of at least a portion of the non-planar surface structure.

* * * * *